United States Patent
Ou et al.

(10) Patent No.: US 7,497,905 B2
(45) Date of Patent: Mar. 3, 2009

(54) TERNARY NITRIDE-BASED BUFFER LAYER OF A NITRIDE-BASED LIGHT-EMITTING DEVICE AND A METHOD FOR MANUFACTURING THE SAME

(75) Inventors: Chen Ou, Hsin-Chu (TW); Wen-Hsiang Lin, Hsin-Chu (TW); Shih-Kuo Lai, Hsin-Chu (TW)

(73) Assignee: Epistar Corporation, Hsinchu (TW)

( * ) Notice: Subject to any disclaimer, the term of this patent is extended or adjusted under 35 U.S.C. 154(b) by 288 days.

(21) Appl. No.: 10/711,567

(22) Filed: Sep. 24, 2004

(65) Prior Publication Data
US 2005/0221520 A1     Oct. 6, 2005

(30) Foreign Application Priority Data
Mar. 11, 2004    (TW) ............................. 93106415 A

(51) Int. Cl.
*C30B 25/02*    (2006.01)
(52) U.S. Cl. ......................................... 117/86
(58) Field of Classification Search ............ None
See application file for complete search history.

(56) References Cited

U.S. PATENT DOCUMENTS

| 5,122,845 A | 6/1992 | Manabe et al. |
| 5,290,393 A * | 3/1994 | Nakamura ................... 438/509 |
| 5,686,738 A | 11/1997 | Moustakas |
| 5,923,950 A * | 7/1999 | Ishibashi et al. .............. 438/46 |
| 6,115,399 A | 9/2000 | Shakuda |
| 2003/0057434 A1 | 3/2003 | Hata et al. |
| 2004/0261693 A1* | 12/2004 | Lai et al. ...................... 117/86 |

FOREIGN PATENT DOCUMENTS

| JP | 2003-309291 | 10/2003 |
| JP | 2003-338662 | 11/2003 |

* cited by examiner

*Primary Examiner*—David E Graybill
(74) *Attorney, Agent, or Firm*—Winston Hsu

(57) ABSTRACT

Ternary nitride-based buffer layer of a nitride-based light-emitting device and related manufacturing method. The device includes a substrate and a plurality of layers formed over the substrate in the following sequence: a ternary nitride-based buffer layer, a first conductivity type nitride-based semiconductor layer, a light-emitting layer, and a second conductivity type nitride-based semiconductor layer. The manufacturing method includes introducing a first reaction source containing a first group III element into a chamber at a first temperature that is subsequently deposited on the surface of the substrate, the melting point of said element being lower than the first temperature. Introducing a second reaction source containing a second group III element and a third reaction source containing a nitrogen element into the chamber at a second temperature, no lower than the melting point of the first group III element, for forming a ternary nitride-based buffer layer with the first group III element.

14 Claims, 9 Drawing Sheets

|  | Brightness at 20mA (mcd) | Forward bias at 20mA (V) | Leakage current at -5V ($\mu$A) | Reverse voltage at -10V (V) |
|---|---|---|---|---|
| Buffer provided by two-step growth method | 37~40 | 3.14~3.25 | 0.00~0.01 | 24~32 |
| Ternary nitride-based buffer layer provided by the present invention | 38~42 | 3.17~3.24 | 0.00~0.01 | 20~33 |

Fig. 8

TERNARY NITRIDE-BASED BUFFER LAYER OF A NITRIDE-BASED LIGHT-EMITTING DEVICE AND A METHOD FOR MANUFACTURING THE SAME

BACKGROUND OF THE INVENTION

1. Field of the Invention

The present invention provides a nitride-based light-emitting device and a method for manufacturing the same, and more particularly, a nitride-based light-emitting device with a ternary nitride-based buffer layer.

2. Description of the Prior Art

The applications of light-emitting diodes are extensive and include optical display devices, traffic signals, data storing devices, communication devices, illumination devices, and medical apparatuses. As such, it is important to increase the brightness of light-emitting diodes, and to simplify manufacturing processes in order to decrease the cost of the light-emitting diode.

In general, a prior art nitride-based light-emitting device includes a nitride-based buffer layer of group AlGaInN formed over a sapphire substrate, and undergoes a nitride-based epitaxy process on the nitride-based buffer layer. Due to problems associated with the matching of crystal lattice constants, dislocation density (which affects quality of the prior art nitride-based light-emitting device), cannot be decreased efficiently. Therefore, the prior art nitride-based epitaxy process seeks to increase the quality of the prior art nitride-based light-emitting device with a two-step growth method, which utilizes low-temperature (500~600° C.) GaN for forming a buffer layer, a heating process (reaching a temperature of 1000~1200° C.) for effecting crystallization, and an epitaxy process for each epitaxy stack layer. The thickness and temperature of the buffer layer, recovery of the heating and re-crystallization processes, plus the ratio and flow rate of gas for each reaction must be controlled precisely, thus making the production process complex and difficult, and as a consequence production efficiency cannot be increased.

SUMMARY OF INVENTION

It is therefore a primary objective of the claimed invention to provide a ternary nitride-based buffer layer of a nitride-based light-emitting device.

The nitride-based light-emitting device includes a substrate, a ternary nitride-based buffer layer formed over the substrate, and a nitride-based light-emitting stack formed over the buffer layer. A method for producing the ternary nitride-based buffer layer includes: (a) introducing a first reaction source including a first group III element into a chamber at a first temperature, so that the first group III element is deposited/absorbed on the surface of the substrate for forming a transient layer. The first temperature is higher than the melting point of the first group III element for insuring that strong links between the first group III elements and substrate will not be built up. (b) At a second temperature which is not lower than the melting point of the second group III element, introducing a second reaction source including a second group III element and a third reaction source including a nitrogen element into the chamber at a second temperature for forming a ternary nitride-based buffer layer on the substrate by reacting with the first group III element.

The present invention method can simplify the complex and difficult production process and decrease the production duration of heating and cooling as well as re-crystallization processes. The present invention can select Ga as the second group III element according to the production process, so as to proceed to grow the high-temperature GaN layer after forming the first group III element transient layer, where the ternary nitride-based buffer layer can be formed naturally without any special treatment, so that the production process can be simplified, and the quality of epitaxy film can be increased. Meanwhile, the cost of production can be decreased.

These and other objectives of the claimed invention will no doubt become obvious to those of ordinary skill in the art after reading the following detailed description of the preferred embodiment that is illustrated in the various figures and drawings.

BRIEF DESCRIPTION OF DRAWINGS

FIG. 8 illustrates a table of a comparison with a blue-light light-emitting diode provided by the present invention and a two-step growth method.

DETAILED DESCRIPTION

Figure 1:
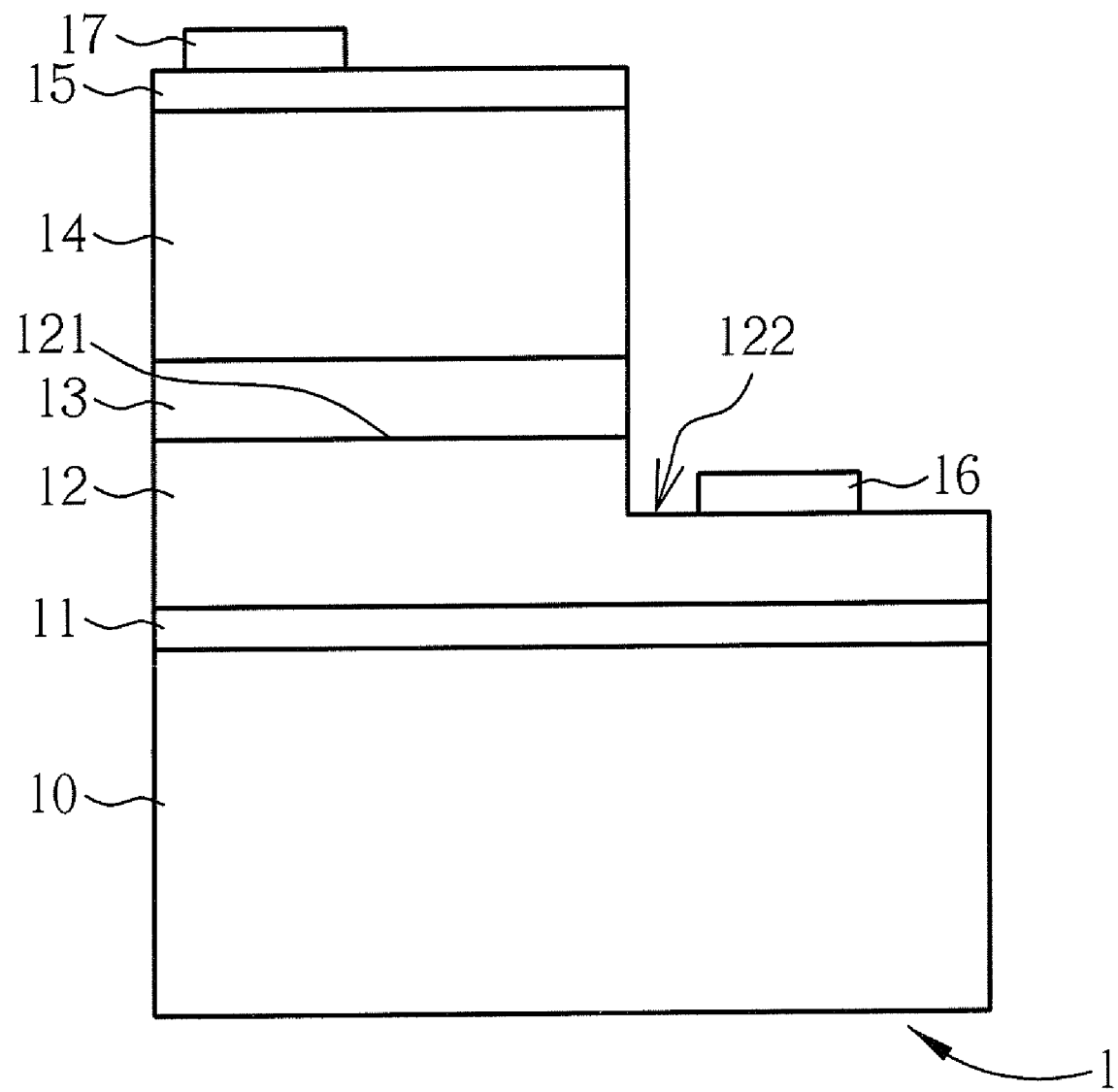
FIG. 1 illustrates a schematic diagram of an embodiment according to the present invention nitride-based light-emitting device with a ternary nitride-based buffer layer.

Please refer to FIG. 1, which illustrates a schematic diagram of a present invention nitride-based light-emitting device 1 with an AlGaN buffer layer. The nitride-based light-emitting device 1 includes a sapphire substrate 10, an AlGaN buffer layer 11 formed over the sapphire substrate 10, an n-type nitride-based semiconductor stack layer 12 formed over the AlGaN buffer layer 11 with an epitaxy area 121 and an n-type electrode contact area 122, a GaN/InGaN multi-quantum well light-emitting layer 13 formed over the epitaxy area 121, a p-type nitride-based semiconductor stack layer 14 formed over the GaN/InGaN multi-quantum well light-emitting layer 13, a metal transparent conductive layer 15 formed over the p-type nitride-based semiconductor stack layer 14, an n-type electrode 16 formed over the n-type electrode contact area 122, and a p-type electrode 17 formed over the metal transparent conductive layer 15.

A method for forming the above-mentioned AlGaN buffer layer of the nitride-based light-emitting device 1 includes the following steps: (a) introducing an Al-containing organometallic reaction source TMAl at 800° C. for forming a aluminum-rich transient layer; (b) introducing a Ga-containing organometallic reaction source TMGa and a nitrogen reaction source NH3 under a lower V/III (V/III<1000) ratio condition; (c) raising the growth temperature to 1050° C. and growing a high-temperature GaN layer with higher V/III ratio (v/III>2000). During the growth of GaN layer, the Al atoms of the aluminum-rich transient layer and the Ga atoms and the N-atoms in the region close to the transient layer will re-arrange. The Al atoms will diffuse upward and the Ga atoms and N atoms will diffuse downward. Then, the Al, Ga and N atoms will bond together and form an AlGaN buffer layer.

Another method for forming the above-mentioned AlGaN buffer layer of the nitride-based light-emitting device 1, includes the following steps: (a) introducing an Al-containing organometallic reaction source TMA1 at 1020° C. for forming an aluminum-rich transient layer; (b) introducing a Ga-containing organometallic reaction source TMGa and a nitrogen reaction source NH3 at the same temperature as in step (a) to grow the high-temperature GaN layer. During the growth of GaN layer, the Al atoms of the aluminum-rich transient layer and the Ga atoms and the N-atoms in the region close to the transient layer will re-arrange. The Al atoms will diffuse upward and the Ga atoms and N atoms will diffuse downward. Then, the Al, Ga and N atoms will bond together and form an AlGaN buffer layer.

Figure 9:
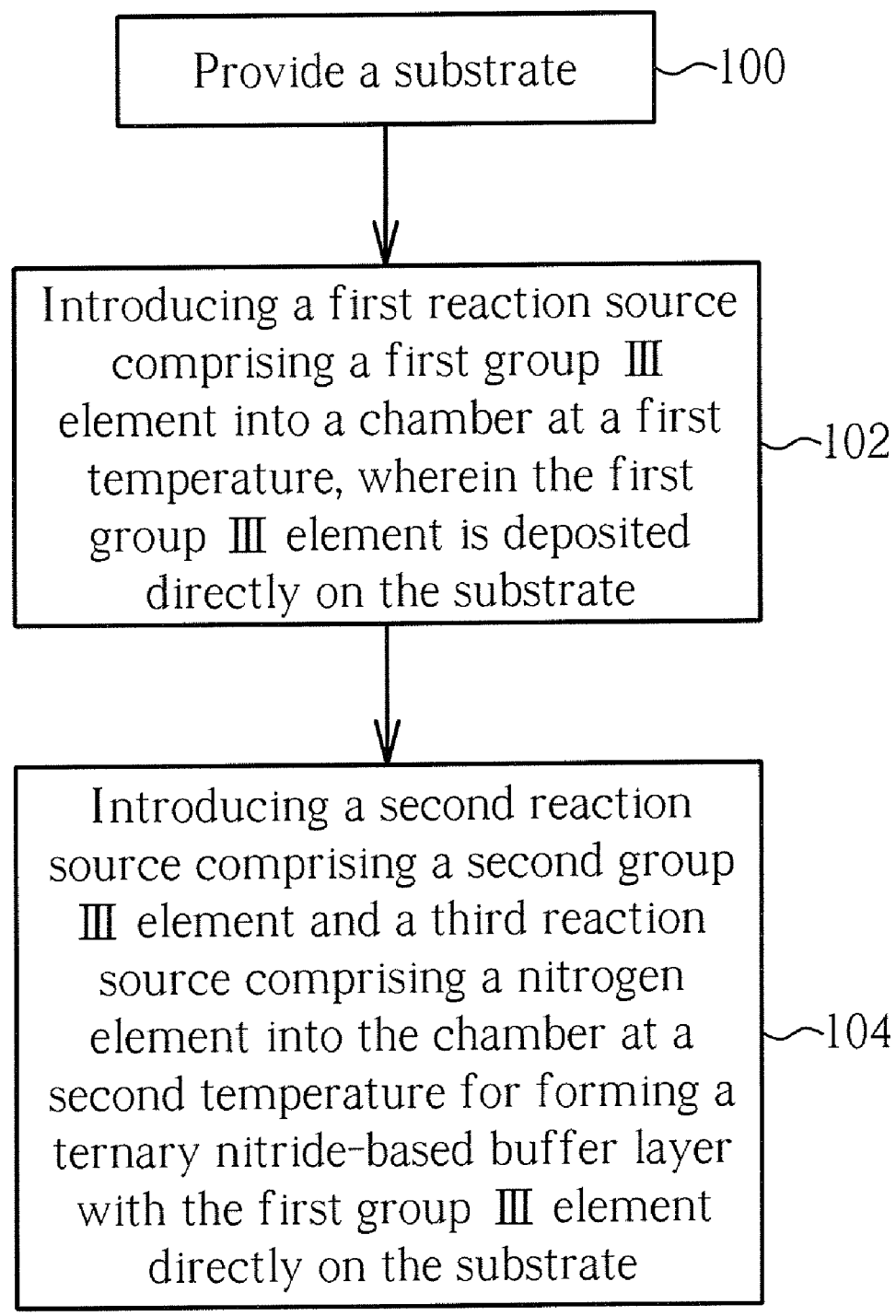
FIG. 9 is a flowchart summarizing the method of AlGaN buffer layer of the nitride-based light-emitting device 1 according to the present invention

Please refer to FIG. 9. FIG. 9 is a flowchart summarizing the method of AlGaN buffer layer of the nitride-based light-emitting device 1 according to the present invention. A substrate is provided in step 100. Next, in step 102, a first reaction source comprising a first group III element is 15 introduced into a chamber at a first temperature. The melting point of the first group III element is lower than the first temperature, and the first group III element is deposited directly on the substrate. Then, in step 104, a second reaction source comprising a second group III element and a third reaction source comprising a nitrogen element are introduced into the chamber at a second temperature for forming a ternary nitride-based buffer layer with the first group III element directly on the substrate. The second temperature is not lower than the melting point of the first group III element.

In the nitride-based light-emitting device 1, the transparent metal contact conductive layer can be replaced with a transparent oxide contact layer for increasing light-emitting efficiency owing to the higher transmittance of the transparent oxide contact layer.

Figure 2:
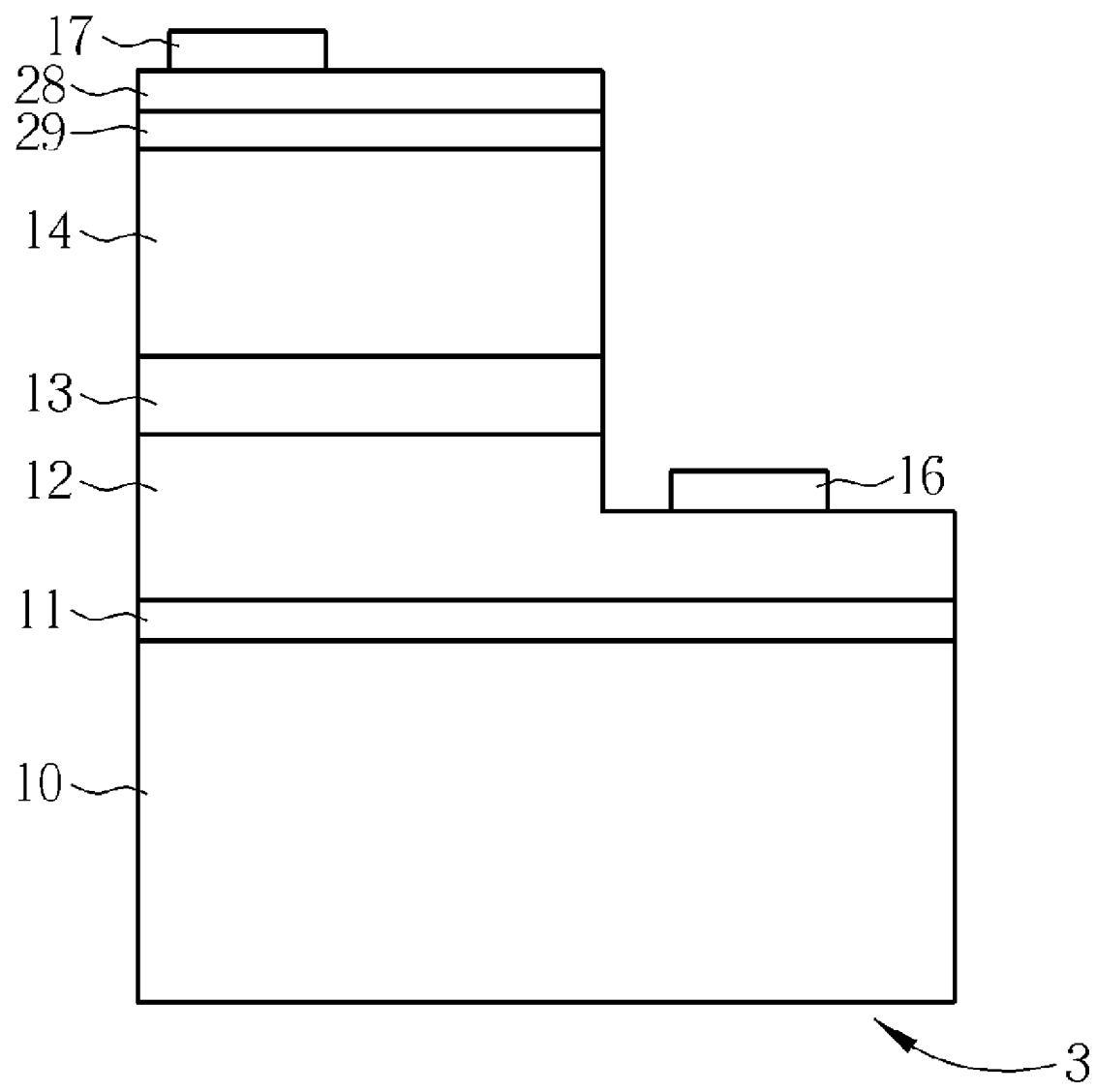
FIG. 2 illustrates a schematic diagram of an embodiment according to the present invention nitride-based light-emitting device with a ternary nitride-based buffer layer.

Please refer to FIG. 2, which illustrates a schematic diagram of another embodiment of a present invention nitride-based light-emitting device 3 with an AlGaN buffer layer. The most significant difference between the nitride-based light-emitting device 1 and the nitride-based light-emitting device 3, is that a transparent oxide contact layer 28 of the nitride-based light-emitting device 3 replaces the transparent metal contact layer 15 of the nitride-based light-emitting device 1, and a high-concentration n-type reverse tunneling contact layer 29 of the nitride-based light-emitting device 3, with a thickness of less than 10 nm and carrier concentration greater than $1 \times 10^{19}$ cm$^{-3}$, is formed between the p-type nitride-based semiconductor stack layer 14 and the transparent oxide contact layer 28, so that an ohmic contact is formed between the transparent oxide contact layer 28 and the high-concentration n-type reverse tunneling contact layer 29. When the nitride-based light-emitting device 3 is operated in forward bias, the interface between the high-concentration n-type reverse tunneling contact layer 29 and the p-type nitride-based semiconductor stack layer 14 is in reverse bias mode and forms a depletion region. In addition, carriers of the transparent oxide contact layer 28 can punch through the p-type nitride-based semiconductor stack layer 14 by means of tunneling effect, which makes the operation bias of the nitride-based light-emitting device 3 reaching the same level as the conventional LED with a transparent metal contact layer. In addition, the AlGaN buffer layers of the nitride-based light-emitting devices 1 and 3 can be replaced with other ternary nitride-based buffer layers, such as InGaN and InAlN buffer layers.

Figure 3:
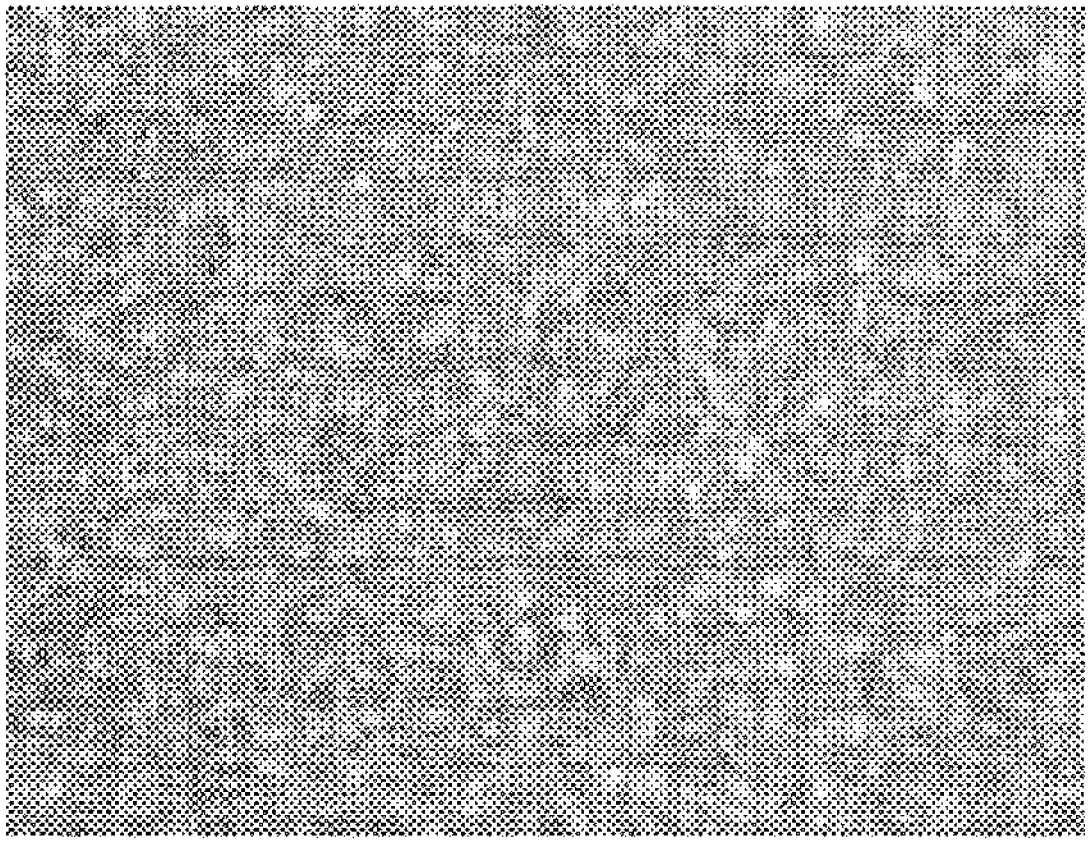
FIG. 3, FIG. 4, and FIG. 5 are photographs illustrating surface morphologies of epi-wafers with an interference optical microscope.
Figure 4:
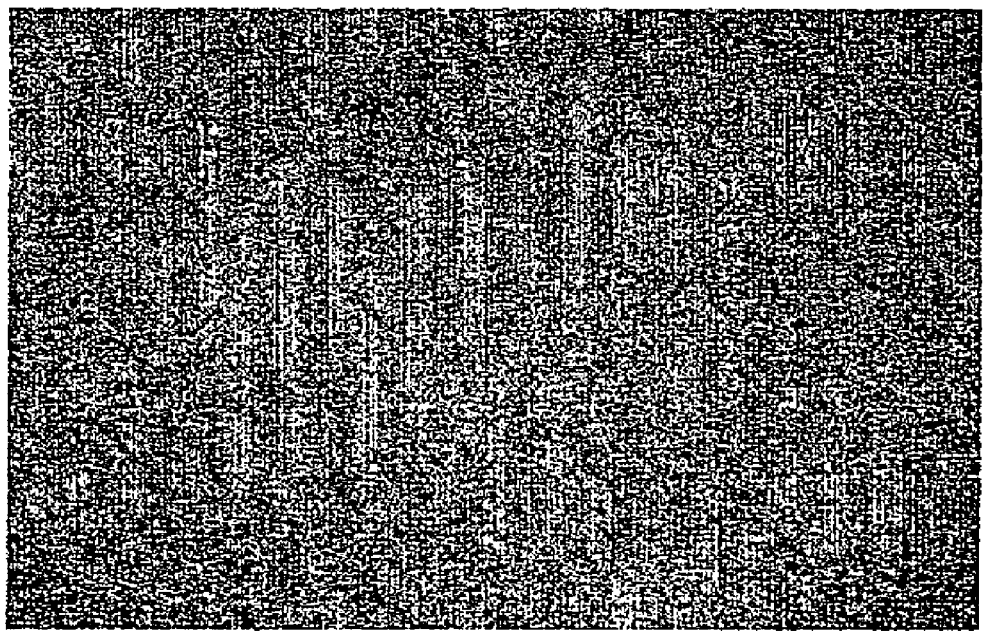
Figure 5:
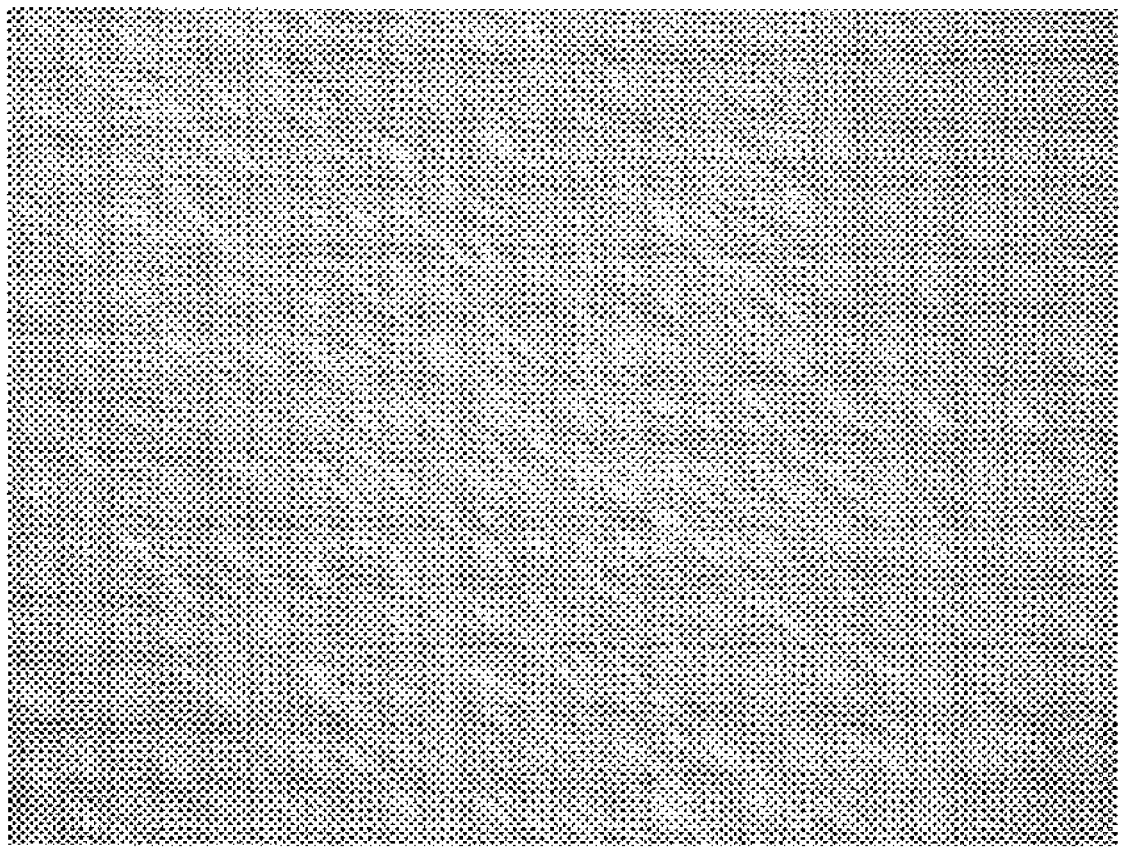

Please refer to FIG. 3, FIG. 4, and FIG. 5, which are photographs illustrating surface morphologies of epi-wafers examined under an interference optical microscope. FIG. 3 shows a surface without any buffer layer; FIG. 4 shows a surface with a prior art GaN buffer layer by means of two-step growth; FIG. 5 shows a surface with the present invention of AlGaN ternary nitride-based buffer layer after high-temperature GaN layer is grown. The surface without any buffer layer forms a hazy surface indicating that it is a non-single crystalline structure, while the surface with the present invention AlGaN nitride-based buffer layer forms a mirror-like surface similar to that with a conventional two-step growth.

Figure 6:
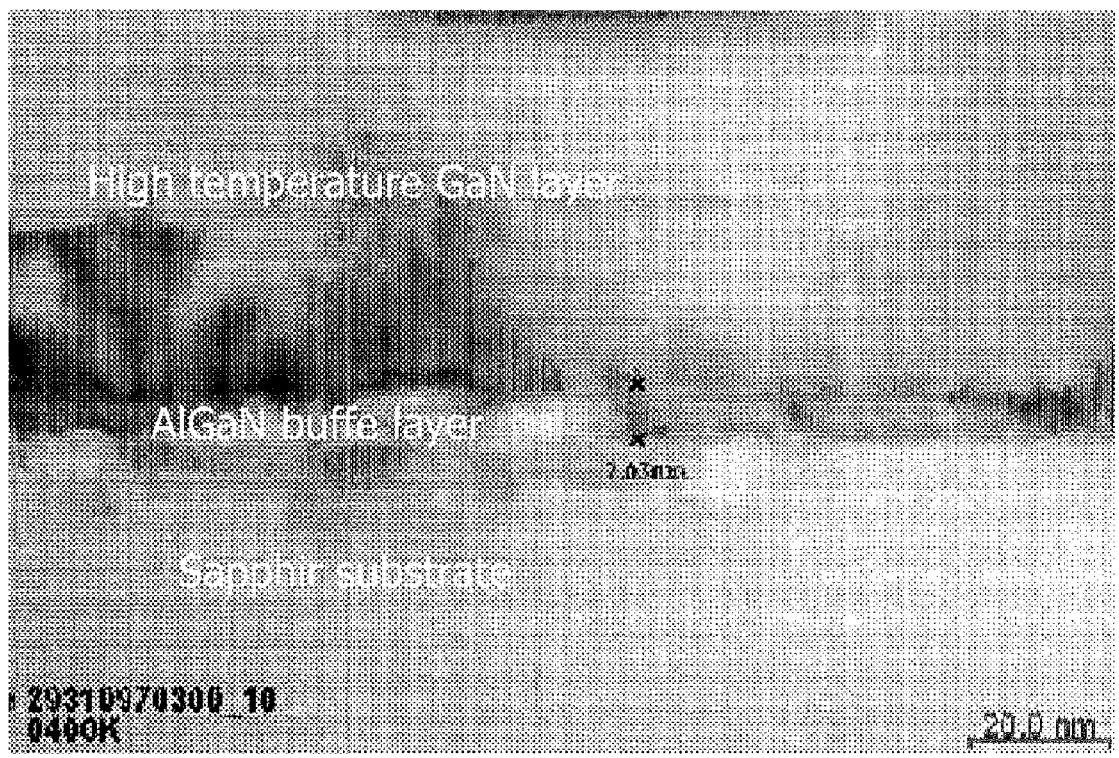
FIG. 6 illustrates a cross section picture with a transmission electron microscope.

Furthermore, we found that to other a mirror-like surface via the present invention method the thickness of buffer layer is less than the one of prior art. Please refer to FIG. 6, which is a cross section picture with a transmission electron microscope. It is obviously shown that the typical thickness of the buffer layer via the present invention is only around 7 nm, in contrast to the conventional two-step growth method with a buffer layer thickness of 20~40nm.

Figure 7:
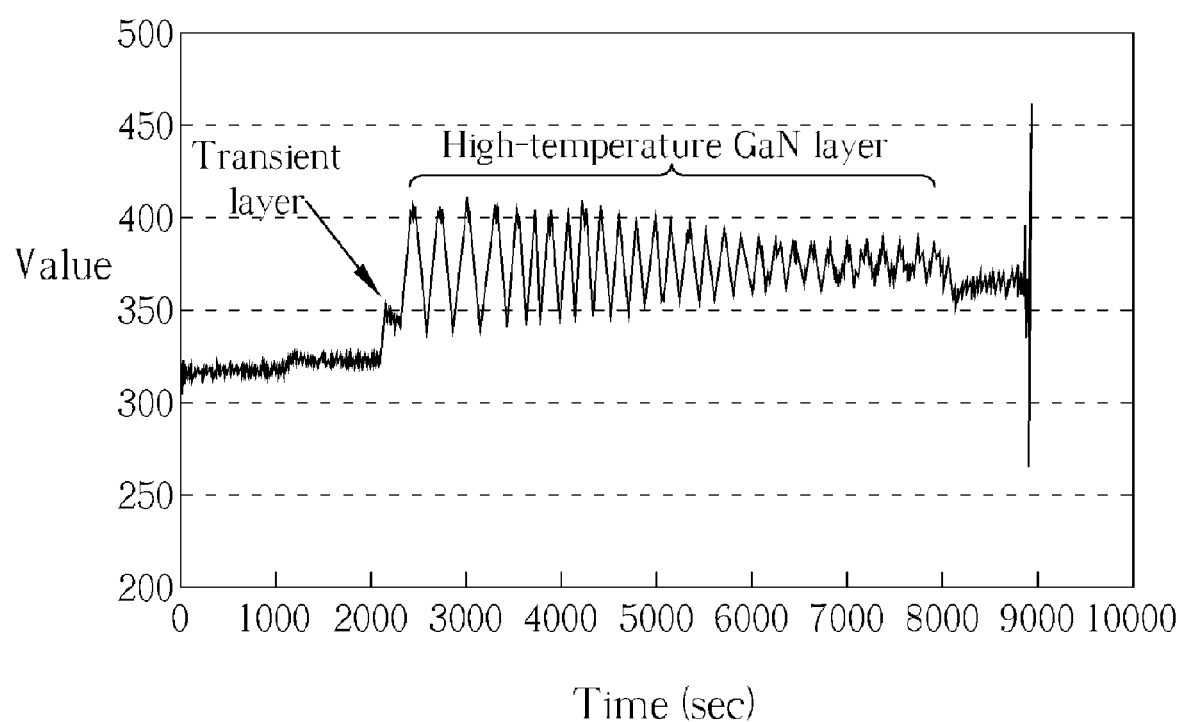
FIG. 7 illustrates an instant reflectivity diagram during epitaxy process.

Please refer to FIG. 7, which shows a reflectance spectrum by in-situ monitor of the present invention when growing a slightly Si-doping GaN layer. It illustrates signals for forming the transient layer and subsequently the high-temperature GaN layer. The crystal quality has been characterized by XRC and Hall measurements. The GaN layer fabricated by the present invention has a full width at half maximum (FWHM) of XRC of 232 arcsec. The Hall carrier mobility can reach as high as 690 cm$^2$/V.s. In comparison with a carrier concentration of $1 \times 10^{17}$ cm$^{-3}$, the GaN layer fabricated by the conventional two-step growth method has a wider XRC FWHM of 269 arcsec, and a lower the Hall mobility of 620 cm$^2$/V.s with a similar carrier concentration of $1 \times 10^{17}$ cm$^{-3}$. It strongly indicates that the crystal quality of the GaN fabricated by present invention is significantly improved over the one of the conventional two-step growth method.

Furthermore, we have made a comparison for blue light-emitting diodes fabricated by the present invention and the two-step growth method. Please refer to FIG. 8, which illustrates a table 100 of a comparison for blue light-emitting diodes fabricating by the present invention and the two-step growth method. From the table 100, it can be seen that in terms of brightness, forward voltage at 20 mA, leakage current at −5V and reverse voltage at −10 µA, LEDs fabricated by present invention is comparable to that using conventional two-step growth method. In addition, the reliability property of blue LED fabricated by present invention is also similar to that of conventional two-step growth method. Therefore, the present invention method provides devices with similar characteristics to those of the prior art, yet utilizes a simplified process.

In the above-mentioned embodiments, the p-type nitride-based semiconductor stack layer further comprising a p-type nitride-based contact layer and a p-type nitride-based cladding layer, while the n-type nitride-based semiconductor stack layer further comprising an n-type nitride-based contact layer and an n-type nitride-based cladding layer. The p-type nitride-based contact layer includes a material selected from a material group consisting of AlN, GaN, AlGaN, InGaN, and AlInGaN, or other substitute materials. The n-type nitride-based contact layer includes a material selected from a material group consisting of AlN, GaN, AlGaN, InGaN, and AlInGaN, or other substitute materials. The p-type or n-type nitride-based cladding layer includes a material selected from a material group consisting of AlN, GaN, AlGaN, InGaN, and AlInGaN, or other substitute materials. The sapphire substrate can be replaced by a material selected from a material group consisting of SiC, GaAs, GaN, AlN, GaP, Si, ZnO, MgO, and glass, or other substitute materials. The ternary nitride-based buffer layer includes a material selected from a material group consisting of InGaN, AlGaN, and InAlN, or other substitute materials. The n-type nitride-based semiconductor stack layer includes a material selected from a material group consisting of AlN, GaN, AlGaN, InGaN, and AlInGaN, or other substitute materials. The nitride-based multi-quantum well light-emitting layer includes a material selected from a material group consisting of GaN, InGaN, and AlInGaN, or other substitute materials. The p-type nitride-based semiconductor stack layer includes a material selected from a material group consisting of AlN, GaN, AlGaN, InGaN, and AlInGaN, or other substitute materials. The transparent metal contact layer includes a material selected from a material group consisting of Ni/Au, NiO/Au, Ta/Au, TiWN, and TiN, or other substitute materials. The transparent oxide contact layer includes a material selected from a material group consisting of indium tin oxide, cadmium tin oxide, antimony tin oxide, zinc aluminum oxide, and zinc tin oxide, or other substitute materials.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for manufacturing a ternary nitride-based buffer layer of a nitride-based light-emitting device, comprising the steps of:
   providing a substrate;
   introducing a first reaction source comprising a first group III element into a chamber at a first temperature, wherein the first group III element is deposited on the substrate;
   introducing a second reaction source comprising a second group III element and a third reaction source comprising nitrogen into the chamber at a second temperature; and
   forming a ternary nitride-based buffer layer by reacting the second group III element and the third reaction source with the first group III element on the substrate;
   wherein the first temperature is different from the second temperature.

2. The method of claim 1, wherein the substrate comprises at least a material selected from the group consisting of sapphire, GaN, AlN, SiC, GaAs, GaP, Si, ZnO, MgO, MgAl2O4, and glass.

3. The method of claim 1, wherein the first temperature is 500° C. or above.

4. The method of claim 1, wherein the second temperature is 700° C. or above.

5. The method of claim 1, wherein the first group III element comprises at least a material selected from the group consisting of Al, Ga, and In.

6. The method of claim 1, wherein the second group III element comprises at least a material selected from the group consisting of Al, Ga, and In.

7. The method of claim 1, wherein the ternary nitride-based buffer layer thickness is between 1 nm and 500 nm.

8. The method of claim 1, wherein the ternary nitride-based buffer layer comprises at least a material selected from the group consisting of InGaN, AlGaN, and InAlN.

9. The method of claim 1, wherein the melting point of the first group III element is lower than the first temperature.

10. The method of claim 1, wherein the second temperature is not lower than the melting point of the first group III element.

11. A method for manufacturing a ternary nitride-based buffer layer of a nitride-based light-emitting device, comprising the steps of:
    providing a substrate;
    introducing a first reaction source comprising a first group III element into a chamber, wherein the first group III element is deposited on the substrate; and
    subsequent to introducing the first reaction source into the chamber, introducing a second reaction source comprising a second group III element and a third reaction source comprising nitrogen into the chamber;
    forming a ternary nitride-based buffer layer by reacting the second group III element and the third reaction source with the first group III element on the substrate.

12. The method of claim 11, wherein the temperature of the step for introducing the first reaction source into the chamber is different from the temperature of the step for introducing the second reaction source and the third reaction source into the chamber.

13. The method of claim 12, wherein the melting point of the first group III element is lower than the temperature of introducing the first reaction source into the chamber.

14. The method of claim 12, wherein the temperature of introducing the second reaction source and the third reaction source into the chamber is not lower than the melting point of the first group III element.

* * * * *